(12) United States Patent
Bae et al.

(10) Patent No.: US 9,502,626 B2
(45) Date of Patent: Nov. 22, 2016

(54) LED LIGHTING MODULE

(71) Applicants: CLPHOTONICS CO., LTD., Seoul (KR); Jeong Woon Bae, Suwon-si, Gyeonggi-do (KR); Jong Young Shim, Seoul (KR)

(72) Inventors: Jeong Woon Bae, Suwon-si (KR); Jong Young Shim, Seoul (KR)

(73) Assignees: CLPHOTONICS CO., LTD., Sinjeong-Ro, Yangcheon-Gu, Seoul (KR); Jeong Woon Bae, Jangan-Gu, Suwonsi, Gyeonggi-Do (KR); Jong Young Shim, Guro-Gu, Seoul (KR)

( * ) Notice: Subject to any disclaimer, the term of this patent is extended or adjusted under 35 U.S.C. 154(b) by 0 days.

(21) Appl. No.: 14/769,050

(22) PCT Filed: Feb. 21, 2014

(86) PCT No.: PCT/KR2014/001448
§ 371 (c)(1),
(2) Date: Aug. 19, 2015

(87) PCT Pub. No.: WO2014/129853
PCT Pub. Date: Aug. 28, 2014

(65) Prior Publication Data
US 2016/0005938 A1 Jan. 7, 2016

(30) Foreign Application Priority Data

Feb. 21, 2013 (KR) .......................... 10-2013-0018636

(51) Int. Cl.
*H01L 33/00* (2010.01)
*H01L 33/60* (2010.01)
(Continued)

(52) U.S. Cl.
CPC ............ *H01L 33/60* (2013.01); *H01L 25/0753* (2013.01); *H01L 33/62* (2013.01); *H01L 2224/48091* (2013.01); *H01L 2224/48137* (2013.01)

(58) Field of Classification Search
CPC ............... H01L 33/60; H01L 25/0753; H01L 2224/48137; H01L 2224/48091; H01L 33/62; H01L 2924/00014
See application file for complete search history.

(56) References Cited

U.S. PATENT DOCUMENTS

| | | | | |
|---|---|---|---|---|
| 2007/0235814 A1* | 10/2007 | Cho et al. | ............... | H01L 33/40 257/369 |
| 2008/0006837 A1* | 1/2008 | Park et al. | ............ | H01L 33/486 257/98 |
| 2010/0212942 A1* | 8/2010 | Tuan et al. | ......... | H01L 23/3735 174/257 |

(Continued)

FOREIGN PATENT DOCUMENTS

| | | |
|---|---|---|
| KR | 10-2008-0004931 A | 1/2008 |
| KR | 10-1161396 B1 | 7/2012 |

(Continued)

*Primary Examiner* — Victor A Mandala
(74) *Attorney, Agent, or Firm* — John K. Park; Park Law Firm

(57) ABSTRACT

Disclosed is an LED lighting module (100) including a substrate (110), a (+) slug layer (121) and a (−) slug layer (123) formed on the substrate and spaced apart from each other at regular intervals, and at least one LED chip (130) formed on the (+) slug layer or the (−) slug layer to have p-type and n-type electrodes, in which the (+) slug layer and the (−) slug layer each include an electrode layer formed on the substrate and a reflection layer covering the electrode layer, and the LED chip is formed on the reflection layer.

18 Claims, 4 Drawing Sheets

(51) Int. Cl.
*H01L 25/075* (2006.01)
*H01L 33/62* (2010.01)

(56) References Cited

U.S. PATENT DOCUMENTS

2011/0121326 A1* 5/2011 Tan et al. ............... H01L 33/60 257/88

2011/0199772 A1* 8/2011 Shibusawa et al. ...... F21K 9/00 362/310

FOREIGN PATENT DOCUMENTS

| KR | 10-1179579 | B1 | 9/2012 |
| KR | 101179579000 | * | 9/2012 |
| KR | 1011795790000 | * | 9/2012 |
| KR | 10-1192183 | B1 | 10/2012 |

* cited by examiner

LED LIGHTING MODULE

TECHNICAL FIELD

The present invention relates to an LED lighting module and, more particularly, to an LED lighting module that emits an increased quantity of light and has improved thermal conductivity and heat emission properties.

BACKGROUND ART

Typically, a LED (light emitting diode) is a semiconductor device that emits light when current flows, and converts electrical energy into light energy using a PN junction diode including GaAs and GaN optical semiconductors. The LED may radiate light with high efficiency at low voltage, thus making it usable in various electronic apparatuses such as home appliances, electronic display boards, and displays.

An LED lighting module typically includes a substrate or a printed circuit board including a conductive layer and an insulating layer. The insulating layer may typically include an insulating material having a predetermined thermal conductive property, such as a thermosetting resin. However, the LED lighting module needs to have excellent thermal conductivity in a vertical direction, but the thermal conductivity of the insulating layer in a vertical direction is not excellent even though the insulating layer includes a material having thermal conductivity, and accordingly, when light is emitted, the light emission efficiency of an LED chip is reduced due to an increase in the temperature, and the defect ratio of the LED lighting module is increased due to heat stress.

A resin used in the LED lighting module has low thermal stability in a relatively high temperature environment, whereby the demand for the development of an LED lighting module that does not include resin is growing. In connection therewith, it is most important to increase the strength of adhesion between a substrate and an electrode. The strength of adhesion between two materials is a very important property in determining the long-term reliability of the lighting. Particularly, the strength of adhesion may be very important in the development of a high-quality high electric power module, which is currently demanded in the lighting field.

Metal having excellent thermal stability and oxidation stability is frequently used to manufacture the lighting module that does not include resin, thus increasing the area of metal exposed on the surface of the module. For white light emission, a fluorescent substance is used, and accordingly, much light is reflected by the fluorescent substance. It is possible to manufacture an lighting module having high efficiency only when reflected light is reflected back to the outside of the module to be extracted. Therefore, the reduction in the secondary reflection ratio attributable to the use of metal having low reflectivity needs to be solved.

DISCLOSURE

Technical Problem

Accordingly, the present invention has been made keeping in mind the above problems occurring in the prior art, and an object of the present invention is to provide an LED lighting module that emits an increased quantity of light and has improved thermal conductivity and heat emission properties.

Another object of the present invention is to provide an LED lighting module including a substrate that does not include an insulating layer so as to emit an increased quantity of light and have improved thermal conductivity and heat emission properties.

A further object of the present invention is to provide an LED lighting module including a substrate that includes a ceramic layer in order to emit an increased quantity of light, have improved thermal conductivity and heat emission properties, and perform an insulating role.

Technical Solution

In order to accomplish the above objects, the present invention provides an LED lighting module including a substrate, a (+) slug layer and a (−) slug layer formed on the substrate and spaced apart from each other at regular intervals, and at least one LED chip formed on the (+) slug layer or the (−) slug layer to have p-type and n-type electrodes. The (+) slug layer and the (−) slug layer each include an electrode layer formed on the substrate and a reflection layer covering the electrode layer, and the LED chip is formed on the reflection layer.

The substrate may include a substrate including at least one of aluminum nitrides (AlN) and aluminum oxides (AlOx).

The electrode layer may include a copper (Cu) layer.

The reflection layer may include a layer including gold (Au).

The reflection layer may include a layer including at least one of silver (Ag), nickel (Ni), and gold (Au).

The reflection layer may include a nickel (Ni)/silver (Ag) layer or a nickel (Ni)/gold (Au)/silver (Ag) layer.

A p-type electrode of the vertical LED chip may be formed to come into contact with the (+) slug layer, and an n-type electrode may be connected to the (−) slug layer using a bonding wire.

The p-type electrode and the n-type electrode of the lateral LED chip may be formed on any one of the (+) and (−) slug layers, and the p-type electrode and a slug layer having no p-type electrode may be connected, the p-type electrode and the n-type electrode may be connected, and the n-type electrode and any one of the (+) and (−) slug layers of an adjacent lateral LED chip may be connected using the bonding wire.

The substrate may include a metal layer and a ceramic layer formed on the metal layer, and the ceramic layer may be mixed with at least one of aluminum nitrides (AlN) and aluminum oxides (AlOx).

The electrode layer may include the copper (Cu) layer.

The reflection layer may include a layer including gold (Au).

The reflection layer may include a layer including at least one of silver (Ag), nickel (Ni), and gold (Au).

The reflection layer may include a nickel (Ni)/silver (Ag) layer or a nickel (Ni)/gold (Au)/silver (Ag) layer.

The p-type electrode of the vertical LED chip may be formed to come into contact with the (+) slug layer, and the n-type electrode may be connected to the (−) slug layer using a bonding wire.

The p-type electrode and the n-type electrode of the lateral LED chip may be formed on any one of the (+) and (−) slug layers, and the p-type electrode and the slug layer having no p-type electrode may be connected, the p-type electrode and the n-type electrode may be connected, and the n-type electrode and any one of the (+) and (−) slug layers of the adjacent lateral LED chip may be connected using the bonding wire.

Advantageous Effects

According to the present invention, an LED lighting module includes a substrate including no insulating layer to increase the quantity of light and improve the thermal conductivity and heat emission properties thereof.

Further, according to the present invention, an LED lighting module includes metal having favorable reflectivity of white light to thereby increase the external extraction efficiency of light reflected back by a fluorescent substance, thus having high light efficiency.

Further, according to the present invention, an LED lighting module includes a substrate including a ceramic layer that increases the quantity of light, has improved thermal conductivity and heat emission properties, and performs an insulating role.

BEST MODE

Figure 1:
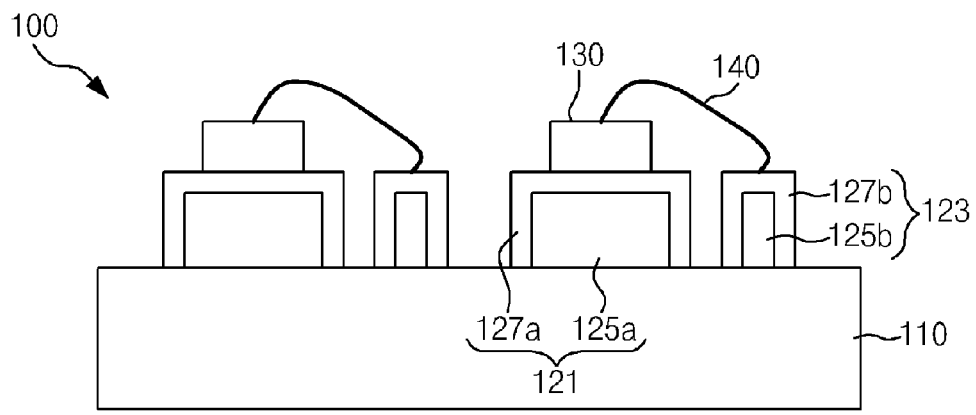
FIG. 1 is a view schematically showing an lighting module using a vertical LED chip according to a first embodiment of the present invention.

The present invention will be described more fully hereinafter with reference to the accompanying drawings, in which exemplary embodiments of the invention are shown so as to be easily understood by a person with ordinary skill in the art. As those skilled in the art would realize, the described embodiments may be modified in various different ways, all without departing from the spirit or scope of the present invention. Portions irrelevant to the description will be omitted in order to clearly describe the present invention, and the same elements will be designated by the same reference numerals throughout the specification.

Figure 2:
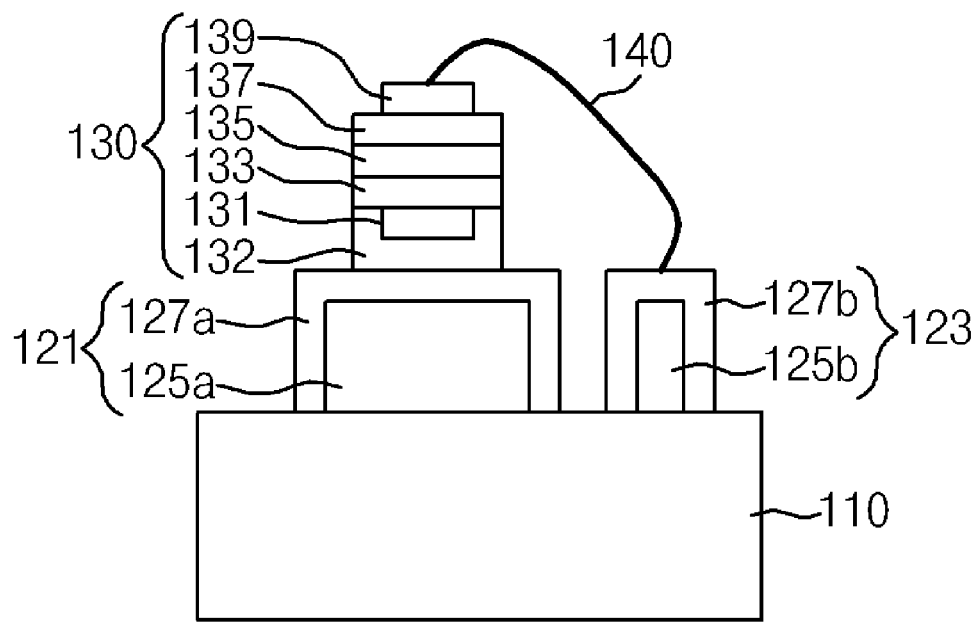
FIG. 2 is a view showing in detail the vertical LED chip included in the LED lighting module of FIG. 1.

FIG. 1 is a view schematically showing an LED lighting module according to a first embodiment of the present invention, and FIG. 2 is a view showing in detail a vertical LED chip.

Referring to FIGS. 1 and 2, an LED lighting module 100 according to the present invention includes a substrate 110, a (+) slug layer 121, a (−) slug layer 123, an LED chip 130, and a bonding wire 140.

The substrate 110 includes a substrate including at least one of aluminum nitrides (AlN) and aluminum oxides (AlOx). The substrate including aluminum nitrides (AlN) or aluminum oxides (AlOx) may have both a very high insulation property, and also have heat resistance, corrosion resistance, and high thermal conductivity. Therefore, the electric stability of the LED lighting module may be improved, the defect ratio of the LED lighting module caused by heat stress may be reduced thanks to the high thermal conductivity property, and the heat emission property of the LED lighting module may be improved. Further, since the LED lighting module according to the present invention may not include an insulating layer including a thermosetting resin, the process of manufacturing the LED lighting module may be simplified, to secure an economic effect of a reduction in manufacturing cost.

The (+) slug layer 121 and the (−) slug layer 123 may be formed on the substrate 110 and spaced apart from each other at regular intervals, and the (+) slug layer 121 and the (−) slug layer 123 may be included to form a pair, but the number of slug layers is not limited.

The (+) slug layer 121 and the (−) slug layer 123 respectively include electrode layers 125a and 125b formed on the substrate 110 and reflection layers 127a and 127b covering the electrode layers 125a and 125b.

The electrode layers 125a and 125b may preferably include a copper (Cu) layer.

The reflection layers 127a and 127b include a layer including at least one of silver (Ag), nickel (Ni), and gold (Au). For example, the reflection layers 127a and 127b may include a silver (Ag) layer. For example, the reflection layers 127a and 127b may include a nickel (Ni) layer. For example, the reflection layers 127a and 127b may include a gold (Au) layer.

Alternatively, the reflection layers 127a and 127b may include a complex layer of two or more of the silver (Ag) layer, the nickel (Ni) layer, and the gold (Au) layer. For example, the reflection layers 127a and 127b may include a nickel (Ni)/silver (Ag) layer or a nickel (Ni)/gold (Au)/silver (Ag) layer. The silver (Ag) layer is configured to be the uppermost of the reflection layers 127a and 127b.

The reflection layers 127a and 127b may be formed using a typical plating or deposition process.

The reflection layers 127a and 127b function to protect the electrode layers 125a and 125b from being corroded or externally contaminated. Further, the reflection layers 127a and 127b may allow light emitted from the LED chip 130 as will be described later to be reflected, thus contributing to an increase in the quantity of light of the LED lighting module.

The LED chip 130 may include a vertical LED chip or a lateral LED chip.

For example, when the LED chip 130 is embodied as the vertical LED chip, the LED chip 130 includes a light emission structure, and a p-type electrode 131 and an n-type electrode 139 are formed on both surfaces of the light emission structure. The light emission structure is also called an epi layer, and a semiconductor layer including a p-type gallium nitride-based semiconductor layer 133 (p-GaN layer), an active layer 135, and an n-type gallium nitride-based semiconductor layer 137 (n-GaN layer) sequentially layered therein. The p-GaN layer 133, the active layer 135, and the n-GaN layer 137 may be a gallium nitride-based semiconductor material having an empirical formula of $Al_xIn_yGa_{(1-x-y)}N$ ($0 \leq x \leq 1$, $0 \leq x \leq 1$, and $0 \leq x+y \leq 1$), and formed through a publicly known nitride deposition process such as a metal organic chemical vapor deposition (MOCVD) process. Additionally, the p-GaN layer 133, the active layer 135, and the n-GaN layer 137 may be a multiquantum well layer including active layers, quantum well layers, and barrier layers repeatedly formed therein. The p-type electrode 131 is formed on the p-GaN layer 133 of the light emission structure, and the n-type electrode 139 is formed on the n-GaN layer 137. Additionally, a support layer 132 may be formed on the p-GaN layer 133 to cover the p-type electrode 131. When the vertical LED chip is formed on the substrate 110, the support layer 132 functions to protect the p-type electrode 131 and support the vertical LED chip 130.

All support layers of the electrode layer 125*a* forming the (+) slug layer 121, the reflection layer 127*b*, and the vertical LED chip 130 layered on the reflection layer 127*b* are made of a conductive material. Further, the n-type electrode is connected to the (−) slug layer 123, which is the conductive material, using the bonding wire 140. Accordingly, when an external power supply is connected to the (+) slug layer 121 and the (−) slug layer 123 to supply electric power, current flows through the light emission structure to emit light from the active layer.

Further, although not shown in the drawings, the LED lighting module according to the present embodiment may further include a fluorescent substance (not shown) applied on the upper surface of the LED chip. The fluorescent substance may be applied on the entire LED chip or only on the surface of the LED chip from which light is emitted. The fluorescent substance may be applied to adjust the color of the emitted light. For example, when a yellow fluorescent substance is applied on a blue LED chip, an LED lighting module emitting white light may be obtained.

Accordingly, the LED lighting module according to the present embodiment includes a substrate 110 that does not include a typical insulating layer. The substrate 110 may have high thermal conductivity to improve the thermal conductivity and heat emission properties of the LED lighting module, thus significantly reducing the defect ratio due to heat stress when the LED lighting module is manufactured. Further, the slug layers 121 and 123 may include the reflection layer 127 to allow light reflected back from the fluorescent substance applied on the LED chip 130 to be reflected back well to the outside of the module when white light is embodied. Accordingly, the quantity of light of the LED lighting module 100 may be increased to thereby improve efficiency of the LED lighting module.

Figure 3:
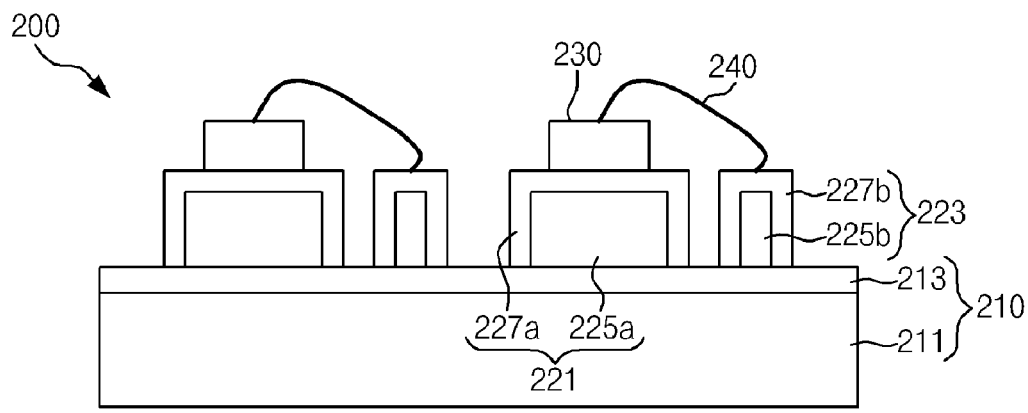
FIG. 3 is a view schematically showing an lighting module using a vertical LED chip according to a second embodiment of the present invention.

FIG. 3 is a view schematically showing an LED lighting module 200 according to another embodiment of the present invention.

The LED lighting module 200 of FIG. 3 includes a substrate 210, a (+) slug layer 221, a (−) slug layer 223, an LED chip 230, and a bonding wire 240.

With the exception of the substrate 210, in the LED lighting module 200 of FIG. 3, the (+) slug layer 221, the (−) slug layer 223, the LED chip 230, and the bonding wire 240 correspond to the (+) slug layer 121, the (−) slug layer 123, the LED chip 130, and the bonding wire 140 of the LED lighting module 100 of FIG. 1, and thus the same description of the same constitutional elements will be omitted.

The substrate 210 included in the LED lighting module 200 of the present embodiment includes a metal layer 211 and a ceramic layer 213 formed on the metal layer.

The substrate 110 included in the LED lighting module 100 of FIG. 1 includes a substrate including at least one of aluminum nitrides (AlN) and aluminum oxides (AlOx), and aluminum nitrides (AlN) or aluminum oxides (AlOx) have an excellent thermal conductive property but entailing high raw material costs. Accordingly, the present embodiment includes the substrate 210 that takes advantage of the merits of aluminum nitrides (AlN) and aluminum oxides (AlOx) while reducing manufacturing costs.

The metal layer 211 of the substrate 210 includes a metal layer including at least one of copper (Cu) and aluminum (Al). For example, the metal layer includes a copper (Cu) layer, an aluminum (Al) layer, or an alloy layer of copper (Cu) and aluminum (Al).

The ceramic layer 213 is formed on the metal layer 211, and includes a ceramic layer mixed with at least one of aluminum nitrides (AlN) and aluminum oxides (AlOx). Aluminum nitride (AlN) powder and/or aluminum oxide (AlOx) powder may be mixed at a predetermined ratio and then applied to a thickness of tens to hundreds of μm, and preferably 300 μm or less, on the metal layer 211 using a spray process to form the ceramic layer 213 according to the present embodiment. For the ceramic layer 213, a mixing ratio of aluminum nitride (AlN) powder and/or aluminum oxide (AlOx) powder may be appropriately selected according to the use of the LED lighting module 200. For example, when an LED lighting module 200 in the 50 W class is manufactured, aluminum oxide (AlOx) powder may be included in a content of 40 to 80 wt % and aluminum nitride (AlN) powder may be included in a content of 20 to 60 wt % on the basis of the total weight of the ceramic layer 213. Alternatively, when an LED lighting module 200 in the 50 to 100 W class is manufactured, aluminum oxide (AlOx) powder may be included in a content of 15 to 50 wt % and aluminum nitride (AlN) powder may be included in a content of 50 to 85 wt % on the basis of the total weight of the ceramic layer 213. Alternatively, when an LED lighting module 200 in the 100 W or more class is manufactured, aluminum oxide (AlOx) powder may be included in a content of 0 to 30 wt % and aluminum nitride (AlN) powder may be included in a content of 70 to 100 wt % on the basis of the total weight of the ceramic layer 213.

According to the present invention, the properties of high thermal conductivity and electrical insulation may be adjusted as desired by a user based on the requirements for the substrate 210. Therefore, the ceramic layer 213 includes aluminum nitrides (AlN) and/or aluminum oxides (AlOx) having the high thermal conductive property to improve thermal conductivity and significantly reduce manufacturing costs compared to substrates including aluminum nitrides (AlN) or aluminum oxides (AlOx) in FIG. 1, whereby the LED lighting module may be produced at further reduced cost.

Therefore, the LED lighting module 200 of FIG. 2 may have all of the merits of the LED lighting module 100 of FIG. 1, and may further include the effect of a reduction in manufacturing cost.

Figure 4:
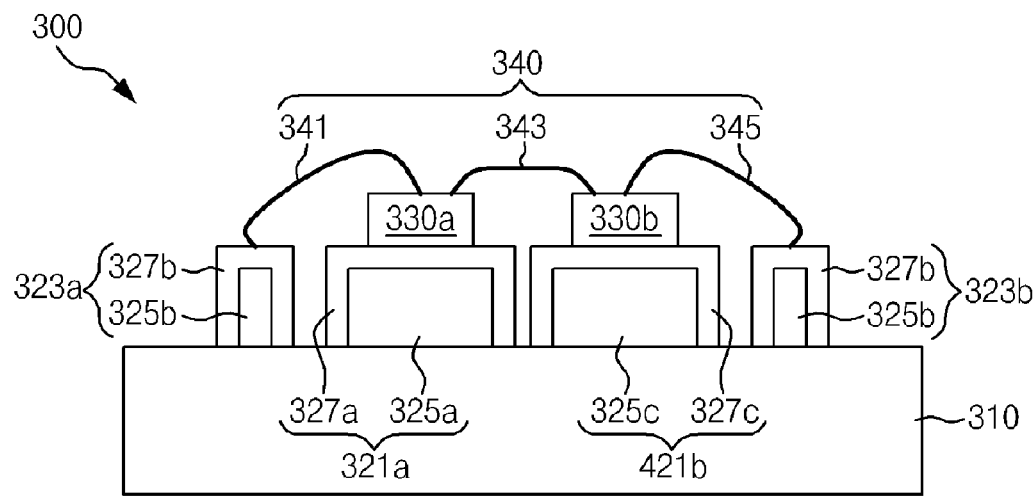
FIG. 4 is a view schematically showing an lighting module using a lateral LED chip instead of the vertical LED chip in the embodiment of FIG. 1.
Figure 5:
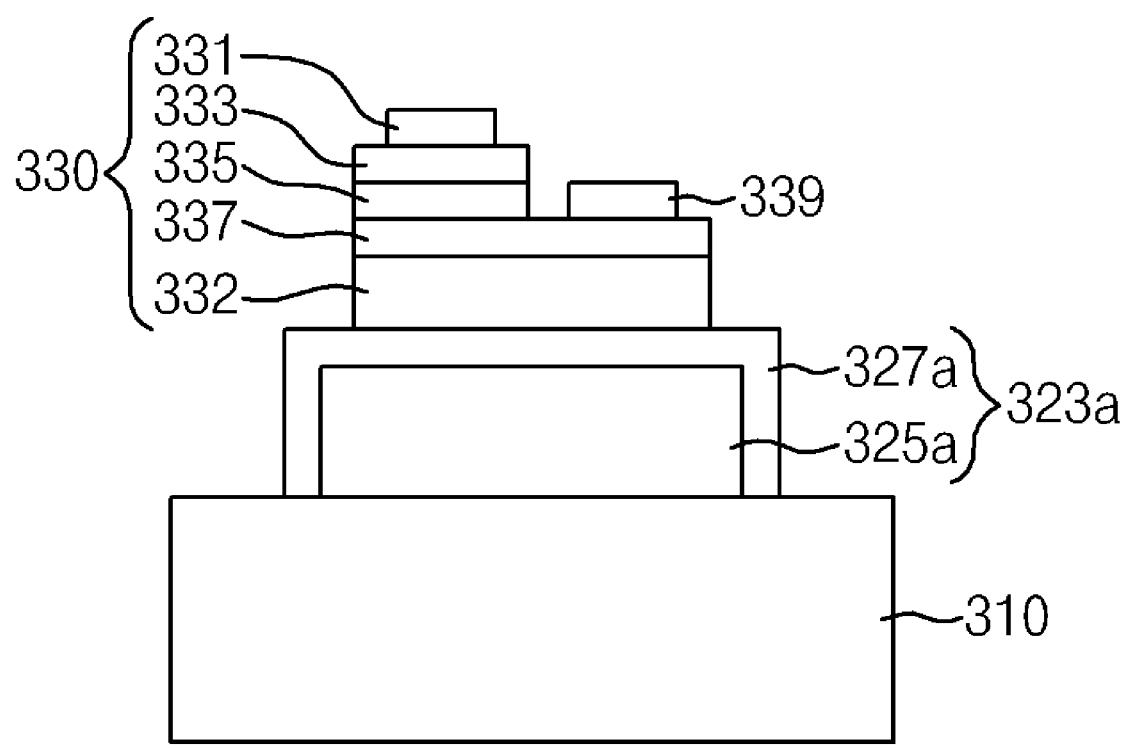
FIG. 5 is a view showing in detail the lateral LED chip included in the LED lighting module of FIG. 1.

FIG. 4 shows the case including the lateral LED chip instead of the vertical LED chip in the embodiment of FIG. 1, and FIG. 5 is a view showing the lateral LED chip in detail.

Referring to FIGS. 4 and 5, an LED lighting module 300 according to the present embodiment includes a substrate 310, (+) slug layers 321*a* and 323*b*, (−) slug layers 323*a* and 321*b*, lateral LED chips 330*a* and 330*b*, and a bonding wire 340.

The detailed description of each constitutional element is the same as or similar to that of FIG. 1, and thus will be omitted. However, the lateral LED chip and the connection of the bonding wire 340 are different from FIG. 1 due to the use of the lateral LED chip in the present embodiment.

A first lateral LED chip 330*a* is formed on a first (+) slug layer 321*a*, a substrate 332 of the first lateral LED chip 330*a* is formed, an n-type gallium nitride-based semiconductor layer 337 (n-GaN layer) is formed on the substrate 332, an n-type electrode 339 is formed on a portion of the n-GaN layer, an active layer 335 is formed on another portion, and a p-type gallium nitride-based semiconductor layer 333

(p-GaN layer) and a p-type electrode 331 are sequentially layered on the active layer 335.

A second lateral LED chip 330b, having the same constitution as the first lateral LED chip, is formed on a second (−) slug layer 321b.

Therefore, the p-type electrode 331 of the first lateral LED chip 330a is connected to the first (−) slug layer 323a using a bonding wire 341, the n-type electrode 339 of the first lateral LED chip 330a is connected to the p-type electrode of the second lateral LED chip 330b using a bonding wire 343, and the n-type electrode of the second lateral LED chip 330b is connected to the second (+) slug layer 323b using a bonding wire 345.

Figure 6:
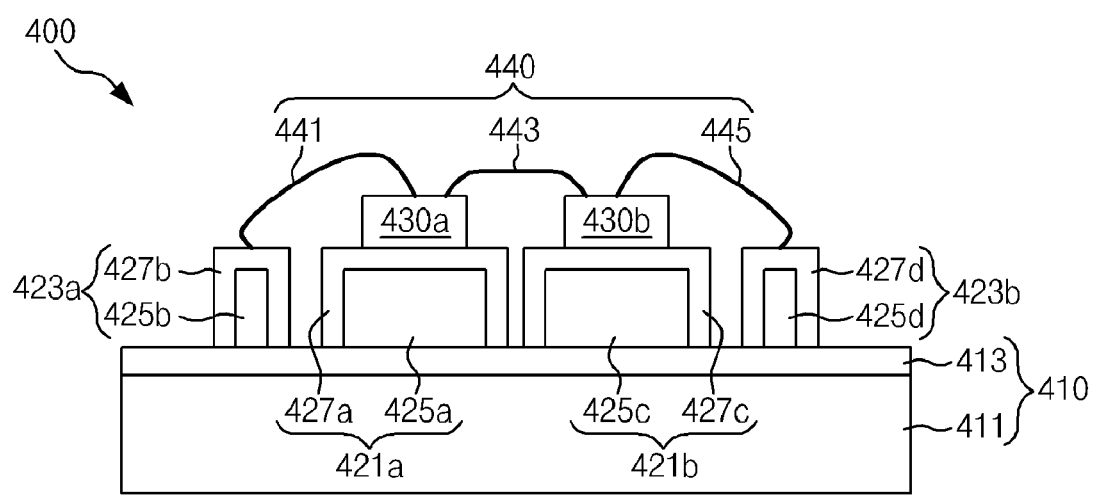
FIG. 6 is a view schematically showing the lighting module using the lateral LED chip instead of the vertical LED chip in the embodiment of FIG. 3.

FIG. 6 shows the case including the lateral LED chip, instead of the vertical LED chip in the embodiment of FIG. 3.

With the exception of the substrate 410, in the LED lighting module 400 of FIG. 6, (+) slug layers 421a and 423b, (−) slug layers 423a and 421b, lateral LED chips 430a and 430b, and a bonding wire 440 are the same as the corresponding constitutional elements of FIG. 4, and thus, the same description will be omitted.

Like the embodiment of FIG. 3, the substrate 410 includes a metal layer 411 and a ceramic layer 413, and the metal layer 411 and the ceramic layer 413 correspond to the metal layer 211 and the ceramic layer 213 of the embodiment of FIG. 3, respectively, and thus, the same descriptions of the same constitutional elements will be omitted.

INDUSTRIAL APPLICABILITY

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An LED lighting module comprising:
a substrate;
a (+) slug layer and a (−) slug layer formed on the substrate and spaced apart from each other at regular intervals; and
at least one LED chip formed on the (+) slug layer or the (−) slug layer to have p-type and n-type electrodes,
wherein the (+) slug layer and the (−) slug layer each include an electrode layer formed on the substrate and a reflection layer covering the electrode layer, and the LED chip is formed on the reflection layer, and
wherein the substrate includes a metal layer and a ceramic layer formed on the metal layer, and the ceramic layer is mixed with at least one of aluminum nitrides (AlN) and aluminum oxides (AlOx), and
wherein when the LED lighting module is less than 50 W class, aluminum oxide (AlOx) powder included in a content of 40 to 80 wt % and aluminum nitride (AlN) powder included in a content of 20 to 60 wt % on the basis of the total weight of the ceramic layer, when the LED lighting module is in the 50 to 100 W class, aluminum oxide (AlOx) powder included in a content of 15 to 50 wt % and aluminum nitride (AlN) powder included in a content of 50 to 85 wt % on the basis of the total weight of the ceramic layer, and when the LED lighting module is greater than 100 W or more class, aluminum oxide (AlOx) powder included in a content of 0 to 30 wt % and aluminum nitride (AlN) powder included in a content of 70 to 100 wt % on the basis of the total weight of the ceramic layer.

2. The LED lighting module of claim 1, wherein an electrode layer includes a copper (Cu) layer.

3. The LED lighting module of claim 2, wherein a reflection layer includes a layer including at least one of silver (Ag), nickel (Ni), and gold (An).

4. The LED lighting module of claim 3, wherein the reflection layer is a nickel (Ni)/silver (Ag) layer or a nickel (Ni)/gold (Au)/silver (Ag) layer.

5. The LED lighting module of claim 3, wherein an LED chip includes a vertical LED chip or a lateral LED chip.

6. The LED lighting module of claim 5, wherein when the LED chip is the vertical LED chip, a p-type electrode of the LED chip is formed to come into contact with a (+) slug layer and an n-type electrode is connected to a (−) slug layer using a bonding wire.

7. The LED lighting module of claim 5, wherein when the LED chip is the lateral LED chip, a p-type electrode and an n-type electrode of the lateral LED chip are formed on any one of (+) and (−) slug layers, the p-type electrode and a slug layer having no p-type electrode are connected, the p-type electrode and the n-type electrode are connected, and the n-type electrode and any one of the (+) and (−) slug layers of an adjacent LED module are connected using a bonding wire.

8. The LED lighting module of claim 1, wherein the metal layer includes a metal layer including at least one of copper (Cu) and aluminum (Al).

9. The LED lighting module of claim 8, wherein an electrode layer includes a copper (Cu) layer.

10. The LED lighting module of claim 9, wherein a reflection layer includes a layer including at least one of silver (Ag), nickel (Ni), and gold (An).

11. The LED lighting module of claim 10, wherein the reflection layer is a nickel (Ni)/silver (Ag) layer or a nickel (Ni)/gold (Au)/silver (Ag) layer.

12. The LED lighting module of claim 10, wherein an LED chip includes a vertical LED chip or a lateral LED chip.

13. The LED lighting module of claim 12, wherein when the LED chip is the vertical LED chip, a p-type electrode of the LED chip is formed to come into contact with a (+) slug layer and a n-type electrode is connected to a (−) slug layer using a bonding wire.

14. The LED lighting module of claim 12, wherein when the LED chip is the lateral LED chip, a p-type electrode and an n-type electrode of the lateral LED chip are formed on any one of (+) and (−) slug layers, the p-type electrode and a slug layer having no p-type electrode are connected, the p-type electrode and the n-type electrode are connected, and the n-type electrode and any one of the (+) and (−) slug layers of an adjacent LED module are connected using a bonding wire.

15. The LED lighting module of claim 4, wherein an LED chip includes a vertical LED chip or a lateral LED chip.

16. The LED lighting module of claim 11, wherein an LED chip includes a vertical LED chip or a lateral LED chip.

17. The LED lighting module of claim 16, wherein when the LED chip is the vertical LED chip, a p-type electrode of the LED chip is formed to come into contact with a (+) slug layer and a n-type electrode is connected to a (−) slug layer using a bonding wire.

18. The LED lighting module of claim 16, wherein when the LED chip is the lateral LED chip, a p-type electrode and an n-type electrode of the lateral LED chip are formed on any one of (+) and (−) slug layers, the p-type electrode and a slug layer having no p-type electrode are connected, the p-type electrode and the n-type electrode are connected, and the n-type electrode and any one of the (+) and (−) slug layers of an adjacent LED module are connected using a bonding wire.

* * * * *